United States Patent [19]

Marshall

[11] 4,321,531
[45] Mar. 23, 1982

[54] DIRECTION SENSITIVE PULSE INITIATOR FOR A WATTMETER

[75] Inventor: Jay K. Marshall, Marietta, Ga.

[73] Assignee: Sangamo-Weston Inc., Atlanta, Ga.

[21] Appl. No.: 76,188

[22] Filed: Sep. 17, 1979

[51] Int. Cl.³ .................................. G01R 27/26
[52] U.S. Cl. .................................. 324/142; 73/510; 250/231 SE; 324/137; 340/347 P; 340/637; 340/672
[58] Field of Search .............. 324/142, 137, 157; 73/510; 340/637, 672, 870.29, 347 P; 200/61.39; 250/231 SE

[56] References Cited

U.S. PATENT DOCUMENTS

| | | | |
|---|---|---|---|
| 2,656,106 | 10/1953 | Stabler | 340/347 P |
| 3,710,265 | 1/1973 | Gray | 340/672 X |
| 3,792,241 | 2/1974 | Sullivan | 235/92 V X |
| 4,034,292 | 7/1977 | McClelland | 324/137 X |
| 4,142,152 | 2/1979 | Fincher | 340/672 X |

*Primary Examiner*—Stanley T. Krawczewicz
*Attorney, Agent, or Firm*—Leydig, Voit, Osann, Mayer & Holt, Ltd.

[57] ABSTRACT

A direction sensitive pulse initiator for a watthour meter having a rotating disc. A pair of sensors sense the presence of an indicator portion or portions, on the rotating disc or on an auxiliary disc, to produce electrical signals which are decoded to initiate clockwise rotation pulses and/or counterclockwise rotation pulses. The pulses are available to be recorded for compiling a record of metered power over a period of time. The sensor electrical signal outputs are decoded so as to determine if the previous exit direction of the indicating portion is the same as its present entry direction, and if this is true a rotation pulse of the appropriate direction is produced.

11 Claims, 5 Drawing Figures

DIRECTION SENSITIVE PULSE INITIATOR FOR A WATTMETER

DESCRIPTION OF THE INVENTION

This invention relates generally to electrical power meters and more particularly concerns direction sensitive pulse initiators for such meters.

A typical watthour meter for measuring power usage over periods of time includes a rotating disc whose rate of rotation is proportional to power usage. Normally, in order to record an energy measurement, the shaft upon which the disc is mounted includes a single pitch worm thread which is meshed with a gear to drive a dial and pointer combination. The energy measured by the meter is read from the pointer positions on the numbered dials.

There are certain advantages to replacing this mechanical measurement recording apparatus with an optical scan system which produces electrical pulses that are counted and stored electronically. There is also a need for such a pulse initiator to produce electrical pulses for making a record of energy usage over different time intervals. Such electrical pulse initiation, derived from photodetector outputs, may be used instead of or in addition to a standard pointer-and-dial accumulated measurement. Interval recording of power usage is useful for survey work by power companies to determine loading during different periods of the day. Also, since time-of-day billings for electrical power are becoming more widespread, there is an increased requirement for a record of the amounts of power delivered at different times.

In using an optical scanning system to produce electrical pulses based upon watthour meter disc rotations, the possibility of reversal of disc rotation must be considered. The rotating disc of a watthour meter may rotate in either a clockwise or a counterclockwise direction, depending upon the direction of power flow. While power is normally delivered in one direction from a power company to a power user, momentary conditions may arise where the disc reverses its direction of rotation, or slows significantly or stops. In an optical scanning system, such small direction reversals or the slow "creeping" of the disc can result in false pulse production if the edge of a detected region on the disc is in the vicinity of the photodetectors. Mechanical restraints to insure unidirectional rotation may be placed upon the rotating shaft upon which the disc is mounted, but such restraints are not totally effective in preventing "creeping" of the disc. Also, it is not convenient to use such mechanical restraints in cases where the conventional pointer and dial mechanism is not being used.

In addition, in certain cases, such as for power transfer between electrical utilities, power flow in two directions is expected and desirable. In such cases, if a pulse initiator is used, a direction sensitive pulse initiator is required. Due to the cost of photodetectors it is also desirable to use a minimum number of photodetectors to produce such a direction sensitive pulse initiator system.

It is therefore an object of the present invention to provide a direction sensitive pulse initiator for an electrical meter which includes only two sensors and avoids the production of erroneous pulses in the event of disc direction reversal.

It is a further object of the present invention to provide such a pulse initiator system in which "creeping" of the rotating disc does not result in the production of false rotation pulses.

Other objects and advantages of the invention will become apparent upon reading the following detailed description and upon reference to the drawings, in which.

Figure 1:
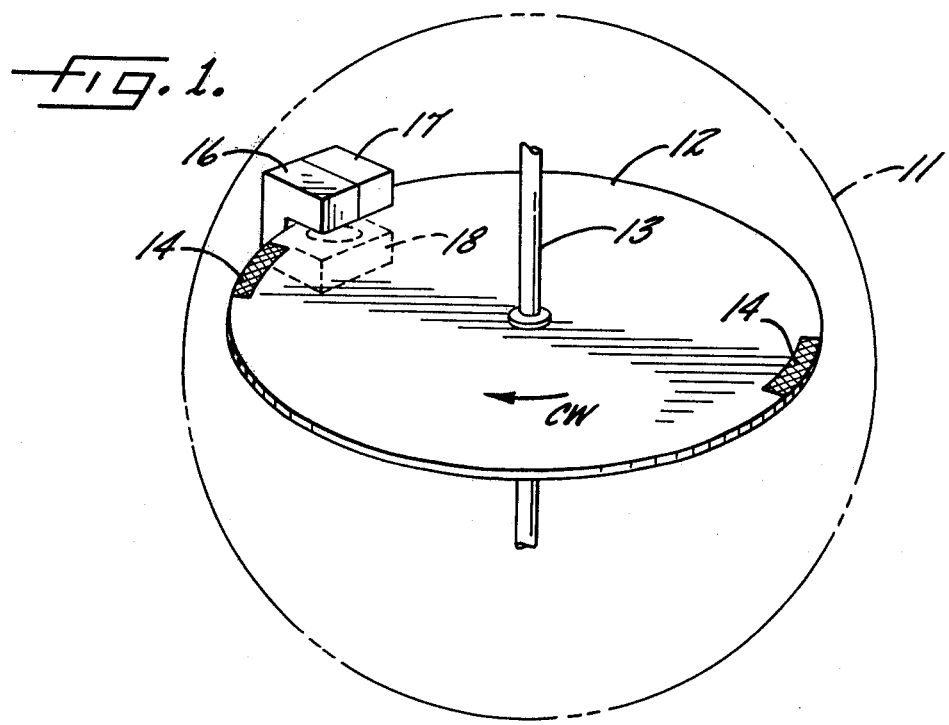
FIG. 1 is a diagrammatic illustration of a watthour meter having a rotating disc bearing indicia and a pair of sensors for detecting the indicia on the disc.

While the invention is susceptible to various modifications and alternative forms, certain illustrative embodiments have been shown by way of example in the drawings and will herein be described in detail. It should be understood, however, that it is not intended to limit the invention to the particular forms disclosed, but, on the contrary, the intention is to cover all modifications, equivalents, and alternatives falling within the spirit and scope of the invention as defined by the appended claims.

Figure 2:
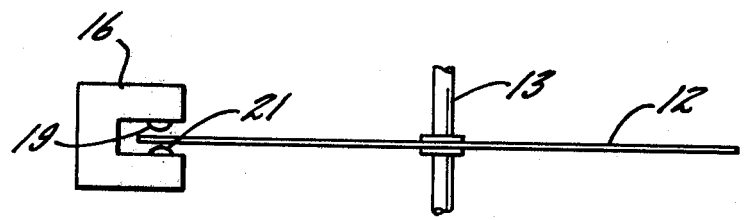
FIG. 2 is a side view of the disc and sensors of FIG. 1.

In FIGS. 1 and 2, a standard integrating rotating disc watthour meter 11 includes a rotating disc 12 mounted on a shaft 13. The shaft 13 and the disc 12 rotate at a rate dependent upon the amount of power being measured by the watthour meter 11. The direction of rotation of the disc 12 is determined by the direction of power transfer in the electrical system being measured by the wattmeter 11.

With the disc 12 rotating at a rate dependent upon power, the number of rotations of the disc 12 is counted, and from this count, a measure of energy transferred, in units such as watthours, is derived. Instead of, or in addition to, driving a mechanical counter coupled to the shaft 13, a pair of sensors 16 and 17 detect the passage of two indicia 14 as the disc 12 rotates. The sensors 16 and 17 are photodetectors which produce an electrical signal when illuminated by a light source 18. The disc 12 is opaque while each indicating portion 14 on the disc 12 is translucent, or even a cut-out section, so that the photodetectors 16 and 17 are activated when the portions 14 are rotated into a position between the light source 18 and the photodetectors.

Each photodetector 16 and 17 includes a light-sensing element 19, and the light source 18 includes a single light-emitting diode (LED) 21 capable of illuminating either or both of the sensor elements 19. Two LEDs 21 might be utilized in the light source 18 to illuminate the photodetectors, but one LED is sufficient if the light-sensing elements 19 are located adjacent one another, such as along the circular path of the indicia 14 as illustrated.

Figure 3:
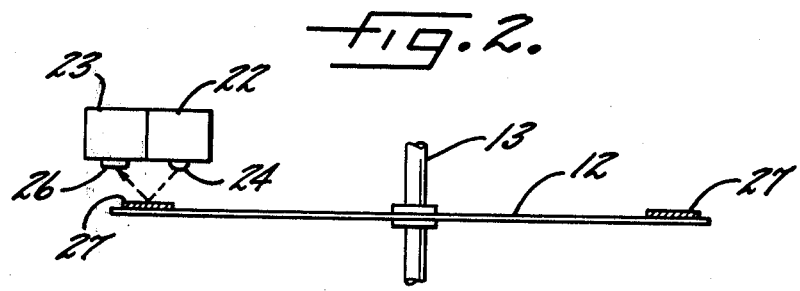
FIG. 3 is a side view of an alternative disc and sensor arrangement.

In FIG. 3 there is illustrated an alternative sensor arrangement utilizing reflective light detection rather than transmission detection. A light source 22 having a LED 24 emits light which is reflected from a reflective surface 27 on the disc 12, and received by a photodetector element 26 of a photodetector 23. The reflective surfaces 27 are provided in locations corresponding to the translucent portions 14 of FIG. 1. In the reflection photodetection arrangement, a second photodetector (not shown) is utilized adjacent the photodetector 23, similar to the side-by-side arrangement of the photodetectors 16 and 17. A second light source 22 might be used, or the LED 24 could provide sufficient light to illuminate both photodetector elements 26.

The sensors need not sense indicia on the rotating disc 12 itself, but may alternatively sense indicia on the shaft 13 or on other elements mounted for rotation with the shaft. For example, in FIG. 4 an auxiliary disc 28 is mounted on the shaft 13 below the disc 12. The auxiliary disc 28 is hollow so that a sensor assembly 31 may be mounted such that the light source and the sensor elements are located on opposite sides of the side wall of the disc 28. Translucent portions 29 are provided in the side wall of the auxiliary disc 28 so that the photodetector elements will be illuminated by the light source each time a translucent portion passes through the sensor assembly 31.

Figure 4:
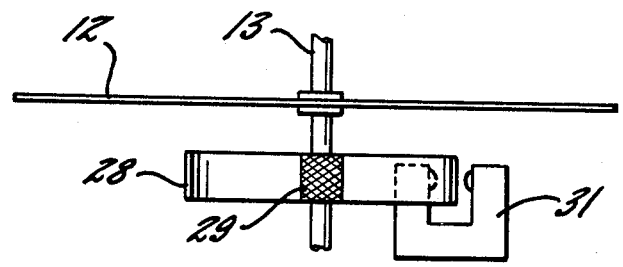
FIG. 4 is a side view of still another sensor arrangement including an auxiliary disc.

In the light transmission photodetection arrangement of FIGS. 1 and 2, the translucent portions 14 are of sufficient length that both photodetectors 16 and 17 may be simultaneously activated for a period of time, as the indicating portion 14 travels over the light source 18. For clockwise rotation of the disc 12, light is detected by the photodetector 16, then by both photodetectors 16 and 17, and finally by the photodetector 17 alone. The opposite sequence occurs for counterclockwise rotation of the disc 12. The alternative sensor arrangements of FIGS. 3 and 4 are constructed to provide similar sequences of photodetector illumination.

Two indicia 14 are used to increase the resolution in counting revolutions of the disc 12. For some types of meters the second indicium provides balance to ensure accurate driving of the disc. The number of indicia is not critical to the present pulse initiation system, it being understood that for each full rotation of the disc 12, generally one pulse is produced for each indicium.

To produce a record of power flow, the rotations of the disc 12 are counted by counting pulses derived from the activation of the sensors 16 and 17 as the indicating portions 14 pass over the light source 18. Since the disc 12 may rotate in either direction, clockwise or counterclockwise, dependent upon the direction of power flow in the electrical system being measured, the pulse output is differentiable for each direction of rotation of the disc. In addition, the production of false pulses is prevented in the event of reversals of direction of the disc 12.

Figure 5:
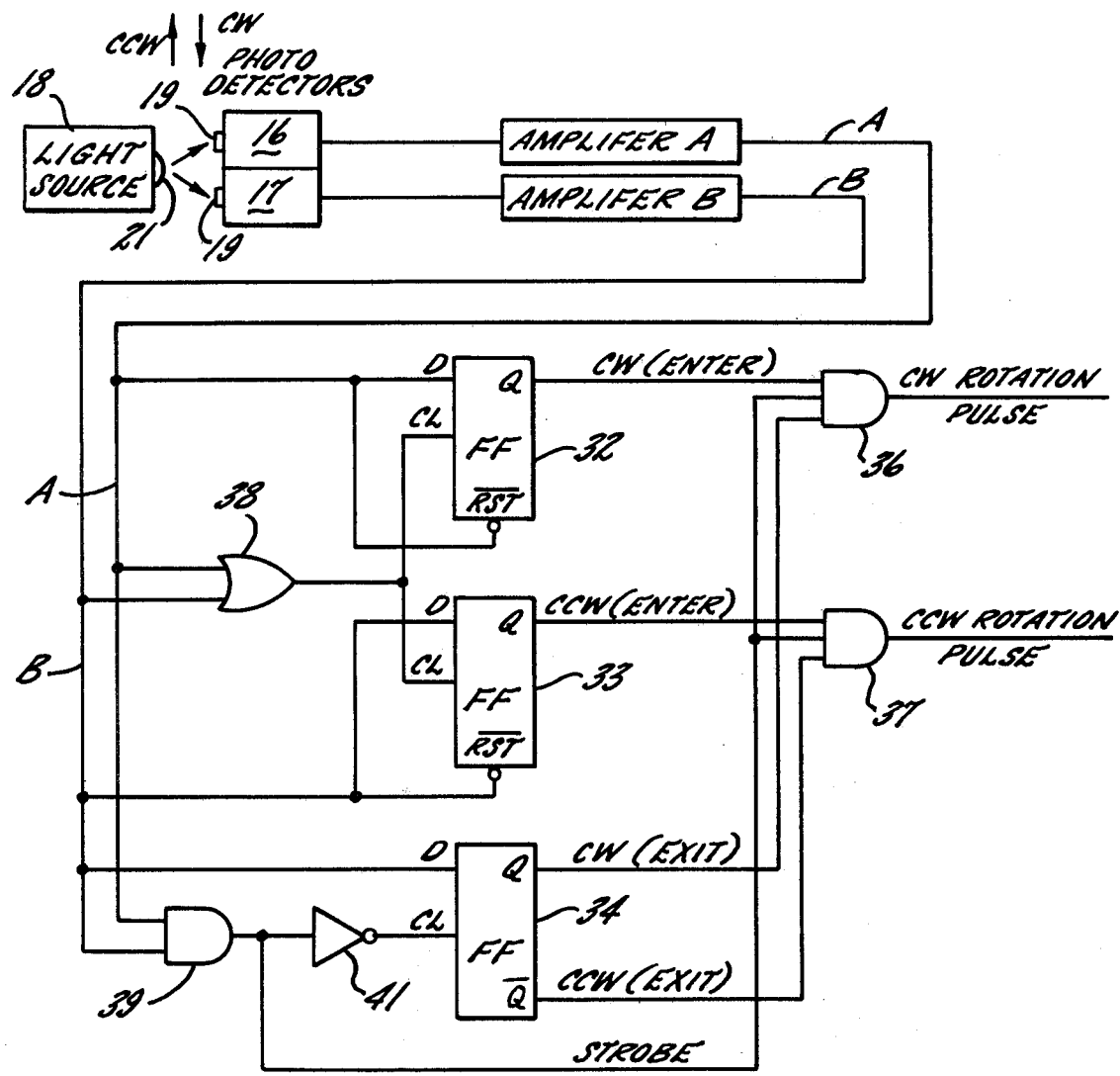
FIG. 5 is a schematic diagram of a pulse initiator circuit according to the present invention.

An exemplary embodiment of electronic circuitry for such a direction sensitive pulse initiator for a watthour meter is illustrated in FIG. 5. The photodetector 16 produces a logic high when illuminated which is coupled to an amplifier A to produce a logic high on an amplifier output line A. Similarly, the activation of the photodetector 17 produces a logic high which is coupled to an amplifier B which has an output line B. Therefore, as an indicating portion 14 rotates past the photodetectors in a clockwise direction, first line A is high, then both lines A and B are high, and finally line B is high. For counterclockwise rotation, as an indicating portion 14 moves past the photodetectors, first line B is high, then both lines B and A, and finally line A. When the indicia 14 are not being sensed by the photodetectors, both lines A and B are low.

These four signal conditions or states for the lines A and B, and the sequence in which they occur, are decoded by the circuitry of the pulse initiator to produce rotation pulses of the proper sense or direction of rotation.

In order to produce a pulse for either direction of rotation, clockwise or counterclockwise, two conditions must coincide: the lines A and B must be in a state for pulse production and this state must have been entered in the same direction as it was previously exited. For example, to produce a clockwise rotation pulse, both lines A and B must be high; this condition must have been entered by clockwise rotation of an indicium; and the previous time both the lines A and B were high an indicium must have exited in the clockwise direction. Clockwise entry to the state in which lines A and B are high occurs when an indicium 14 rotates clockwise, and line A is high before both lines A and B are high. A clockwise exit of an indicium from the vicinity of the sensors, the sensor zone, is indicated by a transition from both lines A and B being high to only the line B being high.

A clockwise entry of an indicium into the sensor zone is determined by a flip flop 32. Counterclockwise entry of an indicium is determined by a flip flop 33. The clockwise or counterclockwise exit of an indicium is established by the outputs of a flip flop 34. The conditions for the generation of a clockwise rotation pulse are ANDed together by an AND gate 36. The conditions for the generation of a counterclockwise rotation pulse are ANDed together by an AND gate 37.

In order to detect a clockwise entry of the indicium 14 into the sensor zone, the line A, which goes high when the photodetector 16 is activated, is connected to the data input and $\overline{RST}$ input of the flip flop 32. Line A is also one input to an OR gate 38 whose output clocks both flip flops 32 and 33. Therefore, when line A goes high, the reset low is removed from the flip flop 32 and its data input is high. The high on line A is also coupled through the OR gate 38 and clocks both flip flops 32 and 33. This clocks the high on the flip flop 32 data input through the flip flop to its Q output so that the CW ENTER input to the AND gate 36 is high.

With continued clockwise rotation, the B line goes high in addition to the line A; and the reset low is removed from the flip flop 33 and its data input goes high. However, due to the previous high on the line A, the output of the OR gate 38 which clocks both the flip flops 32 and 33 is already high so that no clock pulse is produced. Therefore, the data input to the flip flop 33 is not coupled to its Q output. Thus the CCW ENTER input to the AND gate 37 remains low. This will inhibit the production of a counterclockwise rotation pulse since the entry of the indicium to the sensor area has been clockwise rather than counterclockwise.

The lines A and B are also the inputs to an AND gate 39. When both of the lines A and B are high, the output of the AND gate 39 goes high, providing a strobe pulse for both of the AND gates 36 and 37. When the STROBE line is high, either a clockwise or counterclockwise rotation pulse may be produced. With the CW ENTER line and the STROBE line inputs to the AND gate 36 high, the production of a clockwise rotation pulse depends upon the third input to the AND gate 36. If the previous exit of an indicium from the sensors was in a clockwise direction, after both of the lines A and B were activated, the CW EXIT input to the AND gate 36 is high and a clockwise rotation pulse is produced. The width of the pulse depends upon the length of time that the STROBE line is high.

The flip flop 34 maintains an output indicative of the previous exit direction of an indicium from the sensor area, after a condition in which both detectors have been activated (both lines A and B high). To do this, when both lines A and B are high, producing the strobe output from the output of the AND gate 39, this high strobe signal is inverted by an inverter 41 to make the clock input of the flip flop 34 low. As soon as either one of the lines A or B goes low, the output of the AND gate 39 goes low and the output of the inverter 41 goes high clocking the flip flop 34. At the time that the flip flop 34 is clocked, if the indicium 14 has moved in a clockwise direction, the line A is low. The line B, however, will still be high, and this high is clocked through the flip flop 34 to its Q output. The Q output of the flip flop 44 is the CW EXIT line input for the AND gate 36.

The CCW EXIT input for the AND gate 37 is connected to the $\overline{Q}$ output of the flip flop 34 and is therefore low in the event of a clockwise exit. It can be seen that, with the flip flop 34 Q output high and its $\overline{Q}$ output low, the next time that a rotation pulse can be produced is when the lines A and B are both high after a clockwise entry since only the AND gate 36 is enabled to produce a rotation pulse. The production of a counterclockwise rotation pulse is inhibited since the CCW EXIT input to the AND gate 37 is low and will remain low until such a time as both lines A and B are again high followed by a counterclockwise exit.

It should be noted that when one of the inputs to the AND gate 39 goes low, after both have been high, that the STROBE line goes low before any change in the EXIT outputs of the flip flop 34 due to the delay time in the inverter 41 and the flip flop 34. Therefore, the high on the STROBE line has disappeared before the new EXIT signal replaces the former one, preventing a false rotation pulse from being produced. It should also be noted that, in the clockwise rotation example given above, when the line A goes low, the flip flop 32 is reset. Therefore, the Q output of the flip flop 32 will remain low until it can be clocked high by the line A.

For a counterclockwise rotation of an indicium 14 through the sensor area, the line B goes high, clocking both flip flops 32 and 33. Since only the data input to the flip flop 33 is high, only the flip flop 33 Q output goes high, so that the CCW ENTER input to the AND gate 37 is high. When the line A also goes high as the disc continues to rotate counterclockwise, the output of the OR gate 38 remains high and no clocking pulse is produced for the flip flops 32 and 33. However, with both lines A and B high, a high is produced on the STROBE inputs to the AND gates 36 and 37, and the clock input to the flip flop 34 goes low. If the previous exit by the indicium from the sensor area was in the counterclockwise direction, all three inputs of the AND gate 37 are now high and a counterclockwise rotation pulse is produced. With continued counterclockwise rotation of the disc, the line B goes low, placing the data input of the EXIT flip flop 34 low, and this low is clocked through to the Q output of the flip flop. Consequently, the $\overline{Q}$ output of the flip flop 34 is high, indicating a counterclockwise exit. Also, when the line B goes low, the flip flop 33 is reset and its Q output goes low and remains low until it can be clocked high by the line B.

To summarize, there are four states possible for the lines A and B: both high, both low, only A high, and only B high. These states and the sequence in which they occur are decoded to determine if and for which direction, clockwise or counterclockwise, a rotation pulse should be produced. In the illustrated circuit, the state in which either a clockwise rotation pulse or a counterclockwise rotation pulse may be produced, if enabled, is the state in which both of the lines A and B are high. The direction of rotation to be attributed to a rotation pulse is determined by the direction in which the pulse production state (A and B high) was entered. If the line A goes high before both lines are high, a clockwise entry and rotation pulse are designated. If the line B goes high before both lines are high, a counterclockwise entry and pulse are designated. The actual production of a pulse is enabled only if the previous pulse production state (A and B high) was exited in the same rotational direction as it has now been entered. It should be noted that the direction of exit from the pulse production state is noted whether or not a pulse is actually enabled and produced. In the illustrated circuit, both clockwise and counterclockwise pulses are enableable in the same state, that is where A and B are both high, and the exit direction is referenced from this state for both subsequent clockwise and counterclockwise pulse production.

It can be seen from the circuit operation that false rotation pulses will not be produced despite reversals of direction of disc rotation or creeping of the indicia 14 in the vicinity of one of the photodetectors.

As an example of the circuit operation in a disc direction reversal condition, assume a normal clockwise rotation of an indicium 14 through the sensor area. After both lines A and B go low after passage of an indicium 14 through the sensor area, both flip flops 32 and 33 are reset and the CW ENTER and CCW ENTER lines are low. The CW EXIT line on the Q output of the flip flop 34 is high, and the CCW EXIT line on the $\overline{Q}$ output of the flip flop 34 is low. The STROBE line is, of course, low. If the disc 12 reverses direction, it is now rotating counterclockwise; and as the indicium 14 approaches the sensor area, the line B goes high, and the CCW ENTER line goes high.

Therefore, the CW EXIT input of the AND gate 36 is high while the CCW ENTER input of the AND gate 37 is high. With further counterclockwise rotation both of the lines A and B are high, producing a STROBE input for both of the AND gates 36 and 37, but neither AND gate produces a rotation pulse since one input to each AND gate is low.

In the event of creeping of the indicating portion 14, or oscillating of the lines A and B between two states, it can be seen that a rotation pulse is only strobed when both of the lines A and B go high. No rotation pulse can be produced except when this state is achieved. Consequently, oscillating between a state in which neither line A nor line B is high and one in which either the line A or the line B is high cannot produce a rotation pulse. Further, if the state of the lines is oscillating between the condition of both lines being high and of only one line being high, the entry and exit directions will always be opposite and neither AND gate 36 nor 37 will be activated.

In the illustrated embodiment the pulse initiator includes two sensor outputs A and B which may be high or low to produce four discrete output states. In order to practice the invention three output states are sufficient. One state is the pulse production state and transitions to and from either adjacent state are decoded as clockwise or counterclockwise movement of the disc. Also, although the clockwise and counterclockwise pulse production states are the same (A and B high) in the illustrated circuit, it is possible to select one state for clockwise pulse production and a different state for counterclockwise pulse production. Then exit and entry directions would be determined separately with reference to each of the two pulse production states.

Logic state changes for the lines A and B are sequentially produced by one indicium passing adjacent sensors along a path having a fixed radius. Using adjacent sensors permits the use of a single light source but is not critical to producing the line A and B output states. In addition an indicium may have separate parts, such as parts at different radii, so long as the sensors are positioned to produce the requisite sequential output states for the lines A and B.

It should be understood that, while in the illustrated embodiment positive logic circuits have been utilized, analagous negative logic circuitry could be employed. Also, the flip flops and logic devices are presumed to have conventional power supply and ground connections and unused terminals are connected according to conventional practice to insure proper operation of the devices. Finally, where a rotation pulse is referred herein, the term is intended to include a signal having a change in level, such as a step or ramp, which is detectable by subsequent circuitry.

What is claimed is:

1. A pulse initiator for an electrical meter which includes a rotating member whose direction and extent of rotation depends upon the direction and extent of energy transfer in an electrical system to which the meter is connected comprising:
   (a) a first and a second sensor each operable to detect an indicium which is borne by the rotating member so that such detection may be by either sensor alone or by both sensors simultaneously;
   (b) means for producing unique detector state indications representative of detection by the first sensor, detection by the second sensor and detection by both sensors;
   (c) means for decoding the state indications of the means (b) to initiate, when enabled, a pulse indicative of clockwise rotation of the rotating member for a particular detector state indication;
   (d) means for decoding the state indication of the means (b) subsequent to said particular detector state indication of the means (c) to determine an exit direction of rotation;
   (e) means for decoding the state indication of the means (b) prior to said particular detector state indication of the means (c) to determine an entry direction of rotation; and
   (f) means for enabling the means (c) if the entry direction determined by the means (e) and the most recent exit direction determined by the means (d) are both clockwise.

2. The pulse initiator of claim 1 which further comprises:
   (c') means for decoding the state indications of the means (b) to initiate, when enabled, a pulse indicative of counterclockwise rotation of the rotating member for a particular detector state indication;
   (d') means for decoding the state indication of the means (b) subsequent to said particular detector state indication of the means (c') to determine an exit direction of rotation;
   (e') means for decoding the state indication of the means (b) prior to said particular detector state indication of the means (c') to determine an entry direction of rotation; and
   (f') means for enabling the means (c') if the entry direction determined by the means (e') and the most recent exit direction determined by the means (d') are both counterclockwise.

3. The pulse initiator of claim 2 in which the particular detector state indication of the means (c) and the particular detector state indication of the means (c') are the same.

4. The pulse initiator of claim 3 in which the particular detector state indication is representative of detection by both sensors.

5. The pulse initiator of claim 4 in which the rotating member comprises a disc mounted on a shaft with the indicium being borne by the disc.

6. The pulse initiator of claim 4 in which the rotating member comprises a rotating shaft bearing a first disc and a second auxiliary disc with the indicium borne by the auxiliary disc.

7. The pulse initiator of any of claims 1, 2, 3 or 4 in which the rotating member includes a rotating disc bearing said indicium at a location spaced apart from the axis of rotation of the disc so that the indicium defines a closed path as it rotates, the first and second sensors being positioned along said path.

8. The pulse initiator of any of claims 1, 2, 3 or 4 in which the rotating member bears a second indicium detectable by the first and second sensors.

9. A pulse initiator for an electrical meter which has a rotating member whose direction and extent of rotation depend upon the direction and extent of energy transfer in an electrical system in which the electrical meter is connected, the rotating member including at least one readable indicium spaced apart from its axis of rotation and defining a substantially circular path as the indicium rotates about the axis of rotation, comprising:
   (a) a first sensor and a second sensor each operable to detect the indicium and positioned along said circular path and spaced apart from one another such that as the indicium moves past the sensors, both sensors detect the indicium simultaneously for a period of time;
   (b) means for determining the direction of rotation of the indicium after said period of time of detection by both sensors; and
   (c) means for producing a pulse when the indicium is sensed and is moving in the same direction as that most recently determined by the means (b), the pulses for one direction of rotation being differentiable from those indicative of the opposite direction of rotation.

10. A pulse initiator for an electrical meter which includes a rotating member whose direction and extent of rotation depend upon the direction and extent of energy transfer in an electrical system to which the meter is connected comprising:
   (a) a first and a second sensor each operable to detect an indicium which is borne by the rotating member;
   (b) means for producing unique detector state indications representative of indicium detection by the sensors, the sensors being positioned relative to the indicium such that at least three distinct detector states occur sequentially during a rotation of the rotating member;
   (c) means for decoding the state indications of the means (b) to initiate, when enabled, a pulse indicative of rotation in a particular direction by the rotating member for a detector state indication of the center state of said three distinct sequential detector states;

(d) means for decoding the state indication of the means (b) subsequent to said center detector state indication of the means (c) to determine an exit direction of rotation;

(e) means for decoding the state indication of the means (b) prior to said center detector state indication of the means (c) to determine an entry direction of rotation; and (f) means for enabling the means (c) to initiate a pulse if the entry direction determined by the means (e) and the most recent exit direction determined by the means (d) are the same.

11. A pulse initiator for an electrical meter which has a rotating member whose direction and extent of rotation depend upon the direction and extent of energy transfer in an electrical system in which the electrical meter is connected, the rotating member including at least one readable indicium spaced apart from its axis of rotation and defining a substantially circular path as the indicium rotates about the axis of rotation, comprising:

(a) first and second sensors defining a sensor zone and positioned along the circular path for producing sensor signals in response to detection of the indicium, the first and second sensors being displaced from each other such that the sensor signals overlap for only a portion of the duration of said signals;

(b) means responsive to the sensor signals for producing an entry direction signal in response to entry of the indicium into the sensor zone;

(c) means responsive to the sensor signals for producing an exit direction signal in response to exit of the indicium from the sensor zone;

(d) means responsive to the presence of both sensor signals for producing, when enabled, a rotation pulse; and (e) means for enabling the means (d) when the entry signal matches the exit signal.

* * * * *